United States Patent [19]
Benachour

[11] Patent Number: 6,140,845
[45] Date of Patent: Oct. 31, 2000

[54] PSEUDO-DYNAMIC DIFFERENTIAL FLIP-FLOP

[75] Inventor: Abdelaziz Benachour, College Station, Tex.

[73] Assignee: The Texas A&M University System, College Station, Tex.

[21] Appl. No.: 09/205,007

[22] Filed: Dec. 4, 1998

[51] Int. Cl.[7] .............................. G01R 19/00; G11C 7/00; H03F 3/45
[52] U.S. Cl. ........................... 327/57; 327/199; 327/212; 327/202; 327/215
[58] Field of Search .................................. 327/202, 215, 327/212, 199, 57, 208, 207, 201, 214

[56] References Cited

U.S. PATENT DOCUMENTS

| | | | |
|---|---|---|---|
| 4,121,120 | 10/1978 | Wetterling ............................... | 327/215 |
| 4,560,888 | 12/1985 | Oida ......................................... | 327/215 |
| 4,777,388 | 10/1988 | Widener ................................... | 327/202 |
| 4,779,009 | 10/1988 | Tsunoi et al. ............................ | 327/202 |
| 5,001,361 | 3/1991 | Tamamura et al. ...................... | 327/202 |
| 5,049,760 | 9/1991 | Ooms ....................................... | 327/212 |
| 5,892,382 | 4/1999 | Ueda et al. .............................. | 327/199 |

OTHER PUBLICATIONS

Turgut Aytur and Behzad Razavi, Frequency Synthesizer, 1995 IEEE International Solid–State Circuits Conference, ISSCC95, Session 15, Paper FA 15.4.

Turgut Aytur and Behzad Razavi, A 2–GHz, 6–m BiCMOS Frequency Synthesizer, IEEE Journal of Solid–State Circuits, vol. 30, No. 12, Dec. 1995.

*Primary Examiner*—Kenneth B. Wells
*Assistant Examiner*—Long Nguyen
*Attorney, Agent, or Firm*—Baker Botts L.L.P.

[57] ABSTRACT

A differential flip-flop having reduced circuit complexity, clock loading, and power consumption. The circuit is particularly well adapted for systems requiring high-speed differential flip-flops. The proposed flip-flop uses the parasitic capacitors associated with circuit nodes to dynamically store information. The differential flip-flop uses only one current source, as opposed to the two typically required by its conventional counterpart, saving fifty percent of the total power requirement. This power saving is a tremendous advantage at high frequencies, since current must be high to ensure high-speed operation of the transistors in the circuit. Furthermore, the new flip-flop presents a significantly reduced (fifty percent) load to the clock driver, thus further enhancing the power performance of the systems in which it is used.

11 Claims, 2 Drawing Sheets

PSEUDO-DYNAMIC DIFFERENTIAL FLIP-FLOP

BACKGROUND OF THE INVENTION

The invention relates to flip-flops, and more particularly, to differential flip-flops having lower power consumption and simple circuitry.

DESCRIPTION OF THE RELATED TECHNOLOGY

The flip-flop is a basic building block used in synchronous digital systems. Flip-flops may be used as a temporary means to store digital data when used as a register in a central processing unit (CPU) or a computer memory, determine control sequences when used in a state machine, frequency division when used in a prescaler of a radio frequency synthesizer, etc. Flip-flops may have single-ended or differential structures, in the latter case the differential flip-flop has connections and circuitry for both 0 and 180 degree phases of signal inputs and outputs. Although, this representation entails more circuit complexity, it is nonetheless very useful, particularly at high frequencies, because differential circuits can work reliably with only a fraction of the voltage swing required by their single-ended counterparts, are much more immune to externally generated noise, and they generate much less noise. Single-ended flip-flops, on the other hand, require input/output voltage swings that are close to the value of the power supply, as such they result in a high power consumption, particularly at high frequencies.

FIG. 1 illustrates the structure of a conventional differential D flip-flop. This flip-flop, generally represented by the numeral 100, consists of two level-sensitive latches (represented by transistors 106, 108, 110, 112, 126 and 128 for the first latch; and transistors 114, 116, 118, 120, 122 and 124 for the second latch). Each latch requires an independent current source, $I_1$ and $I_2$, (represented by the numerals 102 and 104), to perform its function. Each of these latches can be further subdivided into two functionally distinct elements which will henceforth be referred to as the data set elements, $DS_i$, and the data store elements, $DM_i$. For the first latch, the data set element, $DS_1$, comprises transistors 106 and 108, and the data store element, $DM_1$, comprises transistors 110 and 112. For the second latch, the data set element, $DS_2$, comprises transistors 114 and 116, and the data store element, $DM_2$, comprises transistors 118 and 120. Transistors 122 and 124, and 126 and 128 are current switches that steer current from the current sources 104 and 102, respectively, toward the different elements of the flip-flop depending on the logic values at the inputs 130a and 130b. Resistors 150, 152, 154 and 156 convert currents $I_1$ and $I_2$ into useful voltage signals, which can then be sensed by the following circuit.

The data-set, $DS_i$, and data-store, $DM_i$, functions of the same latch activate on alternate clock phases driving the inputs of the current switches; for example, $DS_1$ loads whatever data is available at the differential inputs 132a and 132b when clock φ is high at clock input 130a, and $DM_1$ subsequently stores, or memorizes, the sampled data when clock φ' is high at clock input 130b. The two pairs of $DS_i$ and $DM_i$ elements, which have one full current source each, are connected in a pipeline configuration and are clocked at a 180° phase difference with respect to each other. This results in a smooth flow of information through the transition-sensitive memory circuit thus obtained. Despite their added complexity, transition-sensitive flip-flops are used more often than level-sensitive latches in synchronous digital systems, because they result in designs where timing constraints are much easier to fulfill in the increasingly complex digital systems.

The flip-flop illustrated in FIG. 1 operates according to the following sequence: when the clock φ at input 130a is high, current source 102 is fully switched into element $DS_1$ which senses the data available on the inputs 132a and 132b, while at the same time, the output nodes 134a and 134b are kept steady by the action of $DM_2$ (transistors 118 and 120), which also receives the entire current from the current source 104. When clock φ' goes high at the input 130b, current sources 102 and 104 are switched into the $DM_1$ and $DS_2$ elements, respectively. This causes the information sampled at the end of the clock φ to be memorized in element $DM_1$ (transistors 110 and 112) and sensed by element $DS_2$ (transistors 114 and 116) for use at the output nodes of the flip-flop on the next cycle. This particular sequence yields what is know as a negative-edge flip-flop, because the output data assumes its new value as clock φ goes from high to low, a positive-edge flip-flop can easily be obtained by interchanging the clock inputs 130a and 130b (φ and φ', respectively). Note that the elements $DS_i$ and $DM_i$ use the same amount of current, $I_1=I_2=I$, to accomplish their quite different tasks.

The differential D flip-flop, as used in the conventional art, has a structure that has a tight coupling between the two functions of the latching elements, such that they must use the same amount of current to perform both functions. It will be appreciated by one skilled in the transistor circuit design arts that such need not be the case, particularly at high frequencies, consequently a lot of power is unnecessarily being wasted in conventional flip-flops.

SUMMARY OF THE INVENTION

The invention overcomes the above-identified problems as well as other shortcomings and deficiencies of existing technologies by providing a power-optimized differential flip-flop suitable for high frequency applications. Furthermore, it has a simpler structure, reduced power consumption and presents a fifty percent reduction in loading of the driving clock system as compared to its conventional counterpart. The basic principle underlying the invention relates to the observation that at high frequencies the duration of the differential input clocks φ and φ' becomes very small such that the memory function, implemented by the $DM_i$ elements as described above, can be assigned, in a larger extent, to the parasitic capacitance associated with the circuit's internal nodes. As such, only a fraction of the current normally used by the $DM_i$ elements is required to keep the information unspoiled until the next refresh cycle. This phenomenon is akin to that encountered in the so named dynamic circuits used in digital systems.

It is clear, then, that an unnecessary, thus potentially avoidable, waste of power is taking place in conventional flip-flops at high operating frequencies. With this realization, the invention makes the differential flip-flop more power efficient by rearranging the internal connections of the conventional flip-flop, using a combination of element merging and transistor sizing. Because out of the four elements (DM and DS) of the conventional flip-flop only two are active at a time (those which receive currents $I_1$ and $I_2$), it is possible to get rid of one current source by merging the two elements that must be active simultaneously. This is achieved by connecting the common sources of the transistors that make up the corresponding DS and DM elements together. Hence, the common transistor sources of $DM_1$ and DS$_2$ are connected together, and those of DM$_2$ and DS$_1$ undergo the same operation. The end result of this rearrangement is a simpler circuit topology, illustrated in FIG. 2, that has two less current-switch transistors 126 or 124, and 128 or 122. More importantly, the new structure of the invention does away with one current source, either current source 102 or 104, bringing the total power consumption down by a half, which is significant at high frequencies, where currents must be high to ensure a fast operation. The other innovative aspect of the new flip-flop relates to the sizing of the transistors of the DM elements. As already disclosed, the memory function does not require a lot of current at high frequencies, and this is achieved in a very simple way in the new flip-flop by sizing the DM transistors smaller than the corresponding DS transistors. How much smaller is a design parameter that allows the designer the freedom to choose the frequency range of the flip-flop.

Other and further features and advantages will be apparent from the following description of the presently preferred embodiment of the invention, given for the purpose of disclosure and taken in conjunction with the accompanying drawings.

DETAILED DESCRIPTION OF THE PREFERRED EMBODIMENTS

Figure 1:
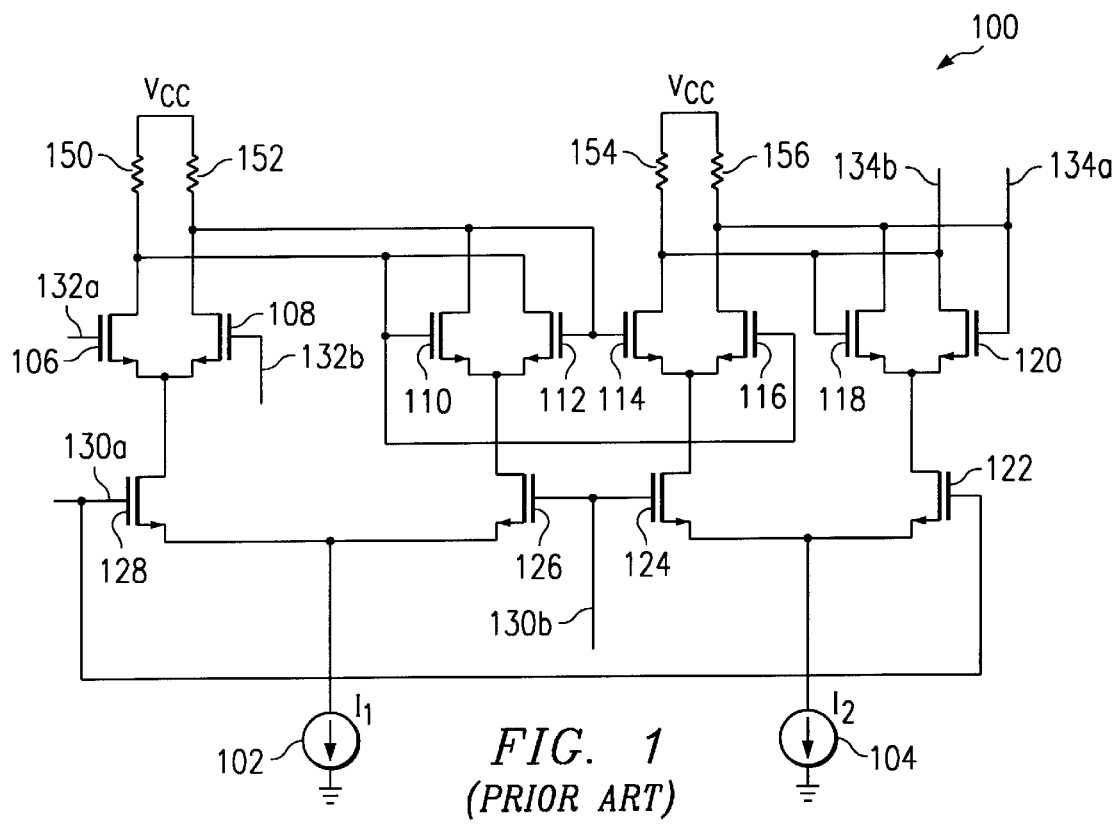
FIG. 1 is a schematic diagram of a prior art differential flip-flop.

The invention is a high speed, low power consumption, differential flip-flop that may be utilized in a wide variety of circuits, such as registers, memories, state-machines, prescalers in frequency synthesis systems, and the like. The invention uses only one current source, reduces the number of clocked transistors from four to two, and reduces the DM element transistor size which results in a faster and more compact flip-flop circuit.

Referring now to the drawings, the details of a preferred embodiment of the invention is schematically illustrated. Like elements in the drawings will be represented by like numbers, and similar elements will be represented by like numbers with a different lower case letter suffix.

Figure 2:
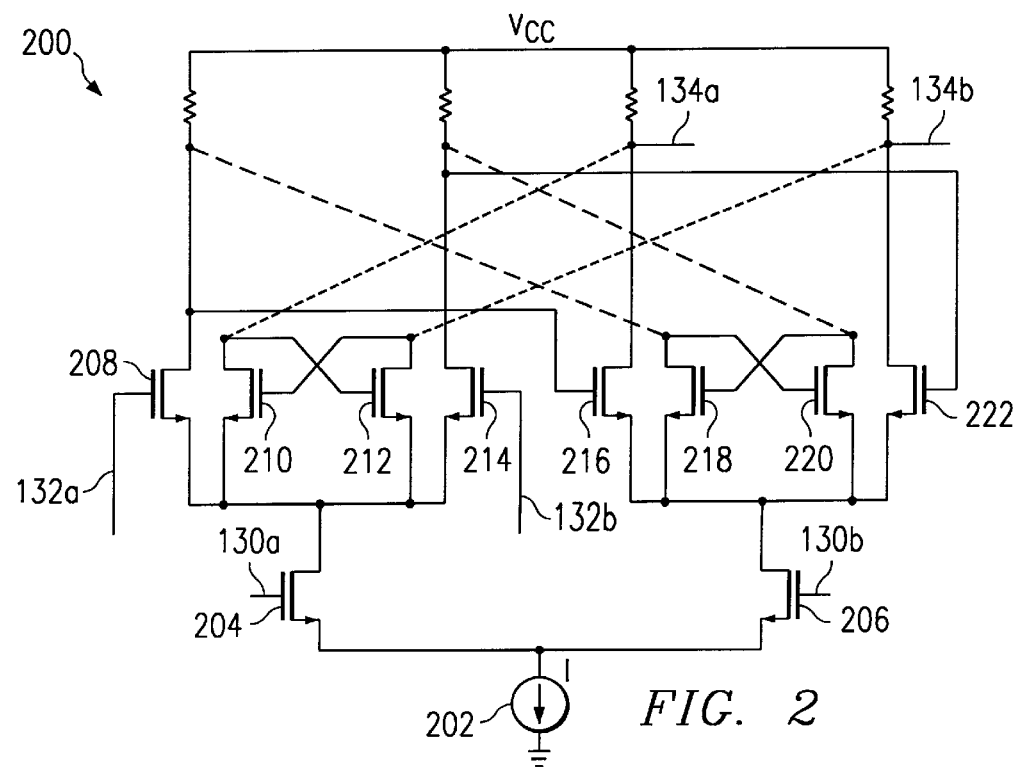
FIG. 2 is a schematic diagram of a differential flip-flop according to the invention.

Referring to FIG. 2, a schematic diagram of a differential flip-flop according to the invention is illustrated. The differential flip-flop is represented generally by the numeral 200. The differential flip-flop 200 needs only one current source compared to the requirement of two current sources for the conventional flip-flop described hereinabove, and has a number of other desirable properties which make it new, novel and non-obvious over the conventional flip-flop, for example but not limitation, at high frequencies. The first such property is the reduction in the number of clocked transistors from four to two, that is, the clock load decreases by a full 50 percent. This is a significant outcome, because it allows further power saving at the system level by significantly affecting an important power-consuming source: the clock. Another advantage of the invention is that the DM elements are comparatively smaller than those of the conventional flip-flop. As a result, the flip-flop is faster, and relatively more compact than the conventional circuit.

One is tempted to push the idea to its logical extreme, and eliminate the DM$_i$ elements altogether at high enough frequencies. In fact, this is exactly what happens in dynamic digital circuits: the memory function is entirely embedded in the parasitics, and no dedicated circuitry is necessary to carry out that important function. In differential, current-mode circuits, however, the dynamic nodes are under strong influence from heavy transient currents that can rapidly drain the small charge of the dynamic information during the cross-over period, when $\phi=\phi'$. For this reason, a minimum amount of boosting is necessary to guard against such spurious discharging. In the invention illustrated in FIG. 2, that boosting is provided by a very small DM structure whose current requirement, determined by the desired frequency range of operation, is met by an adequate sizing of its component transistors with respect to those of its associated DS element.

The higher the frequency of operation, the lesser boost, because the time window during which a spurious discharge can occur is proportionally reduced. In practice, one is also concerned about the lower end in frequency of operation. It is easy to understand that as the circuit relies more and more on dynamic charge storage, the minimum lowest frequency that can be accommodated will inevitably increase, reducing the useful frequency range of the circuit. To operate the flip-flop at a desired frequency range, iterative simulations may be used to find the best transistor sizing: the transistors preferably will be small enough to accommodate the highest frequency, yet big enough to properly function at the lowest frequency.

The flip-flop illustrated in FIG. 2 operates according to the following sequence: When clock $\phi$ at input 130a is high, current source 202 is fully switched into the DS$_1$ element (transistors 208 and 214) which sense the data available on the inputs 132a and 132b. At the same time, a small fraction of the current 202 is diverted away from DS$_1$ by DM$_2$ element to boost the dynamic nodes 134a and 134b and help keep their small charge from vanishing. When the clock $\phi'$ goes high at the input 130b, the same basic operations are repeated with DS$_2$ taking on the role of DS$_1$ and DM$_1$ that of DM$_2$. In this instance, current from the current source 202 is steered into DS$_2$ and DM$_1$, and the information just sampled during clock $\phi$, maintained by DM$_1$, sets the final values on nodes 134a and 134b (outputs of the flip-flop). This particular sequence yields what is know as a negative-edge flip-flop, because the output data assumes its new value as clock $\phi$ goes from high to low, a positive-edge flip-flop can easily be obtained by interchanging the clock inputs 130a and 130b ($\phi$ and $\phi'$, respectively).

The invention may be readily utilized in any high frequency circuit requiring one or more differential flip-flops. A particularly important instance where this flip-flop may be used with great advantage is in low-power frequency divide-by-two circuits. These circuits are very important in frequency/clock synthesis systems where they find application in frequency dividers, counters, frequency prescalers and the like.

Figure 3:
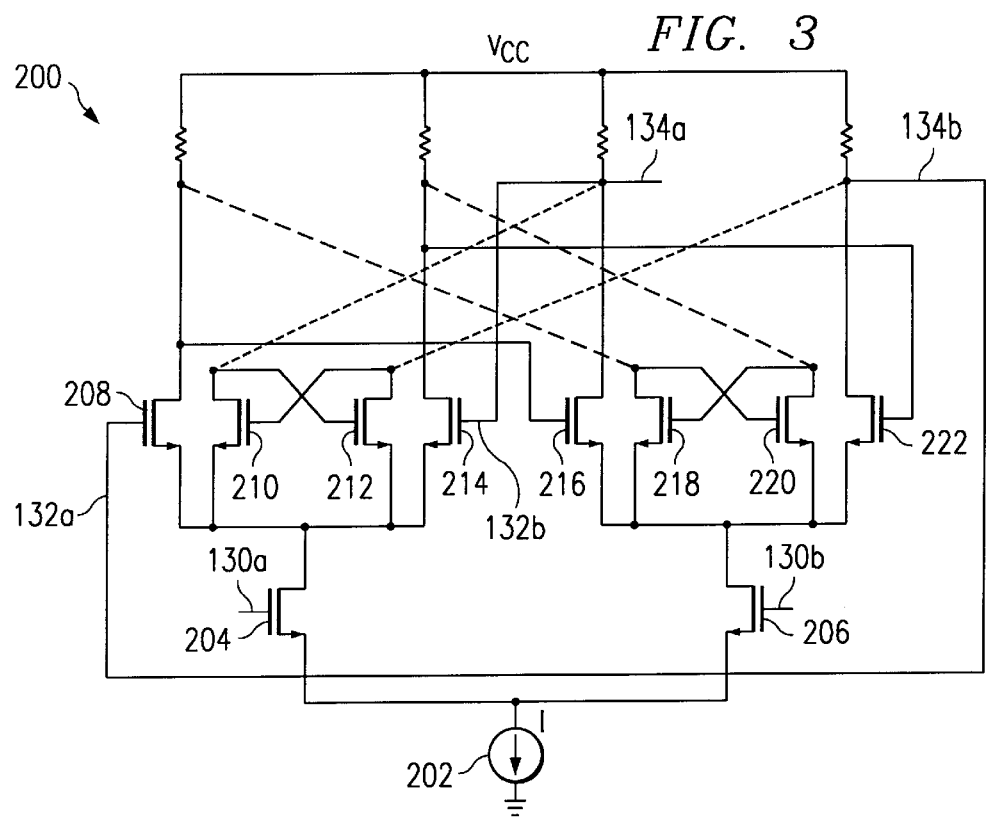
FIG. 3 is a schematic diagram of the flip-flop of FIG. 2 connected as a divide-by-two circuit.

FIG. 3 illustrates a schematic diagram of the flip-flop of FIG. 2 connected as a divide-by-two circuit, in which the outputs of the flip-flop are fed back to the input in a reverse way. Hence, the gate of transistor 208 is connected to the drain of transistor 222. The gate of transistor 214 is connected to the drain of transistor 216. All other connections are the same as those illustrated in FIG. 2.

Figure 4:
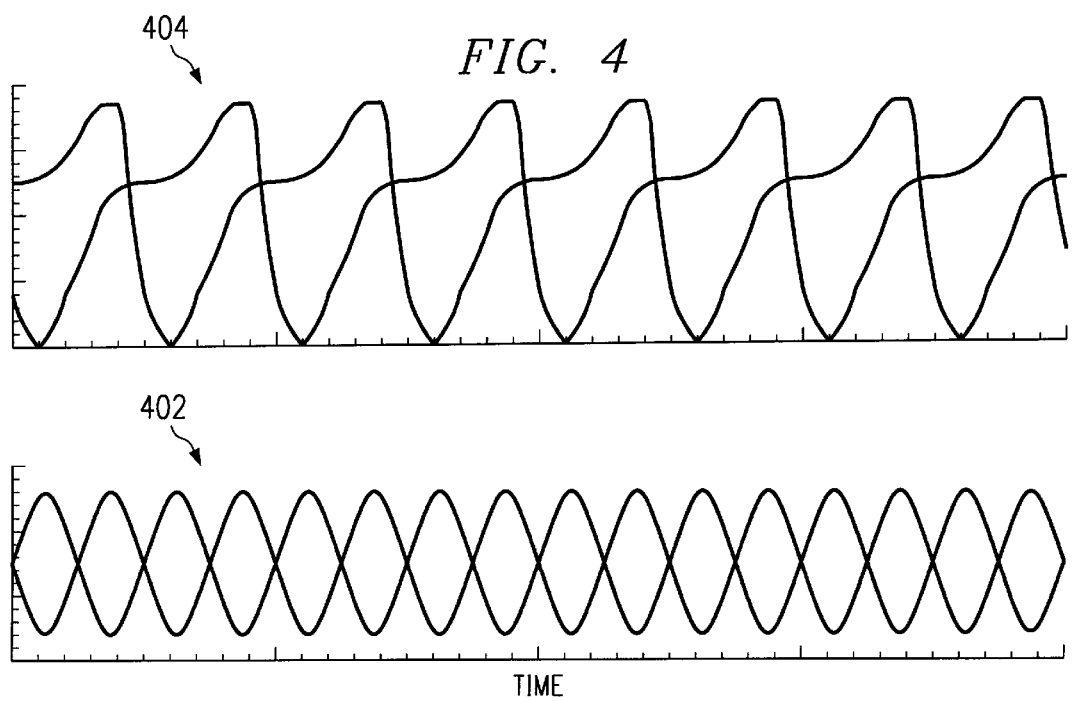
FIG. 4 is a graphical representation of the input and output waveforms of the divide-by-two circuit of FIG. 3.

FIG. 4 illustrates the input waveform, represented by the numeral 402, and the output waveform, represented by the numeral 404, of the divide-by-two circuit illustrated in FIG. 3. The divide-by-two circuit based on the flip-flop invention may, preferably, be used in the circuits of commonly owned, co-pending patent application Ser. No. 09/176,991; filed Oct. 22, 1998, entitled "A Fully Differential Phase Switching Dual-Modulus Prescaler" by Abdelaziz Benachour, and incorporated by reference herein. All divide-by-two circuits used in that application may, preferably, incorporate the circuit illustrated in FIG. 3. The invention flip-flop greatly enhances the low power consumption and high frequency performance of the dual-modulus prescaler described in the co-pending application referenced hereinabove improved because of the low power consumption of the divide-by-two circuit illustrated in FIG. 3. Other uses and applications of the invention will be readily apparent to those skilled in digital and communications circuits.

The invention, therefore, is well adapted to carry out the objects and attain the ends and advantages mentioned, as well as others inherent therein. While the present invention has been depicted, described, and is defined by reference to particular preferred embodiments of the invention, such references do not imply a limitation on the invention, and no such limitation is to be inferred. The invention is capable of considerable modification, alternation, and equivalents in form and function, as will occur to those ordinarily skilled in the pertinent arts. The depicted and described preferred embodiments of the invention are exemplary only, and are not exhaustive of the scope of the invention. Consequently, the invention is intended to be limited only by the spirit and scope of the appended claims, giving full cognizance to equivalents in all respects.

What is claimed is:

1. A differential flip-flop, comprising:
    a first data set element having a differential input;
    a second data set element having a differential output;
    a first data store element;
    a second data store element;
    an integrated current source that is operable for a substantial reduction in total power consumption; and
    a differential clock input circuit, wherein said differential clock input circuit connects said first data set element and said first data store element to said integrated current source when a clock input is at a first logic level, and said differential clock input circuit connects said second data set element to said integrated current source when the clock input is at a second logic level.

2. The differential flip-flop of claim 1, wherein a differential input of said second data set element is connected to a differential output of said first data set element.

3. The differential flip-flop of claim 1, wherein a differential output of said first data store element is connected to the differential output of said second data set element.

4. The differential flip-flop of claim 1, wherein said first data set element comprises a pair of metal oxide field effect transistors.

5. The differential flip-flop of claim 1, wherein said second data set element comprises a pair of metal oxide field effect transistors.

6. The differential flip-flop of claim 1, wherein said first data store element comprises a pair of metal oxide field effect transistors.

7. The differential flip-flop of claim 1, wherein said second data store element comprises a pair of metal oxide field effect transistors.

8. The differential flip-flop of claim 1, wherein said differential clock input circuit comprises a pair of metal oxide field effect transistors.

9. A differential flip-flop, comprising:
    a first data set differential transistor pair having a differential input;
    a second data set differential transistor pair having a differential output;
    a first data store differential transistor pair;
    a second data store differential transistor pair;
    an integrated current source that is operable for a substantial reduction in total power consumption; and
    a differential clock input transistor pair, wherein said differential clock input circuit transistor pair connects said first data set differential transistor pair sources and said first data store differential transistor pair sources to said integrated current source when a clock input is at a first logic level, and said differential clock input circuit transistor pair connects said second data set differential transistor pair sources to said integrated current source when the clock input is at a second logic level.

10. The differential flip-flop of claim 9, wherein the drains of said first data store differential transistor pair are connected to the drains of said second data set differential transistor pair.

11. The differential flip-flop of claim 9, wherein the gates of said second data set differential transistor pair are connected to the drains of said first data set differential transistor pair.

* * * * *